United States Patent [19]

Williams

[11] 4,161,032
[45] Jul. 10, 1979

[54] SERIAL ARITHMETIC FUNCTIONS WITH MAGNETIC BUBBLE LOGIC ELEMENTS

[75] Inventor: Richard P. Williams, Columbia, Md.

[73] Assignee: The United States of America as represented by the Director of the National Security Agency, Washington, D.C.

[21] Appl. No.: 878,207

[22] Filed: Feb. 16, 1978

[51] Int. Cl.$^2$ .................. G06F 7/48; G11C 11/14
[52] U.S. Cl. ............................... 364/714; 365/5
[58] Field of Search ............................ 364/714; 365/5

[56] References Cited
U.S. PATENT DOCUMENTS

| | | | |
|---|---|---|---|
| 3,678,287 | 7/1972 | Chow | 365/5 |
| 3,750,106 | 7/1973 | Caron | 364/900 |
| 3,798,607 | 3/1974 | Minnick et al. | 364/200 |
| 3,894,223 | 7/1975 | Majima et al. | 364/714 |
| 3,983,383 | 9/1976 | Naden | 364/714 |
| 3,986,016 | 10/1976 | Linn et al. | 364/714 |
| 4,011,461 | 3/1977 | Chang et al. | 365/5 |

*Primary Examiner*—Jerry Smith
*Attorney, Agent, or Firm*—John R. Utermohle; Barry N. Young

[57] ABSTRACT

Compact arrangements of two-input magnetic bubble logic gates providing bubble devices for performing serial integer arithmetic on binary integers are disclosed. Using only a small number of different types of logic gates, designs are given for devices for performing serial addition, subtraction, multiplication and division arithmetic operations on binary integers, represented as sequences of magnetic bubbles. All logical interactions use bubble repulsion to prevent bubbles from transferring to adjacent propagation paths via preferred transitions. By using only two-input gates and a pipeline computational structure, hardware design is simplified and advantage is taken of the inherent serial nature of bubble technology. The simple gate interconnection geometry has a minimum of feedback paths and results in devices which are not burdened with excessive numbers of bubble generators, annihilators or crossovers.

18 Claims, 19 Drawing Figures

SERIAL ADDER

SERIAL ARITHMETIC FUNCTIONS WITH MAGNETIC BUBBLE LOGIC ELEMENTS

BACKGROUND AND SUMMARY OF THE INVENTION

This invention relates generally to magnetic bubble devices and more particularly to magnetic bubble devices for performing serial arithmetic operations on binary integers and special purpose pipeline processors using the same.

Magnetic bubble technology development has primarily focused on memory applications. Magnetic bubble technology has been shown to be capable of yielding relatively compact LSI chips having large memory storage capability, at relatively low cost. In some applications, bubble technology may achieve considerable advance over semiconductor technology in chip area utilization. Since it is feasible to make bubble chips larger than semi-conductor chips, bubble technology permits a greater degree of integration to be achieved. Bubble chips generally require only one critical masking step in their fabrication process. Therefore, they are more economical to produce than semiconductor chips. Furthermore, bubble devices operate on less power than most comparable semiconductor devices.

Bubble technology may also be used for logic operations. A variety of useful logic functions has been demonstrated, using the repulsive interaction between bubbles to perform logic operations. For example, U.S. Pat. Nos. 3,731,109 to Garey, 3,743,851 to Kohara, 3,750,106 to Caron and 3,909,622 to Minnick, disclose various bubble logic devices such as AND, NAND, OR, NOR, Exclusive-OR, NOT and inversion. Although the principles of bubble logic have been demonstrated, logic design exercises have produced generally pessimistic estimates of bubble logic performance in comparison to semiconductor technology. These unfavorable comparisons have been due to the constraints under which magnetic bubble devices must operate and the lack of logic designs compatible with these constraints.

One constraint on magnetic bubble technology is the relatively slow speed of bubble propagation, currently approximately 0.5 MHz in commonly used bubble materials. In addition, since bubbles propagate serially in shift register fashion along propagation paths, the geometry problems associated with the interconnection of gates and the equalization of propagation delays may be quite significant. Although various logic schemes have been suggested to avoid some of these difficulties, bubble logic designs, for the most part, have been aimed at achieving a general purpose logic capability which is obtained at the expense of globally efficient designs. For example, U.S. Pat. No. 3,798,607 to Minnick, discloses a general purpose computer design based upon bubble technology. This computer executes instructions slowly and consequently its applications are very limited. It is clear from the intrinsic characteristics of bubble technology, that arbitrary interconnections of bubble logic gates cannot be accomplished with efficient utilization of chip area. Nevertheless, specific applications exist where the required data rate is matched to the bubble propagation speed and where pipeline bubble logic designs can be implemented efficiently in terms of chip area utilization, with minimum area devoted to gate interconnections and bubble generators and annihilators.

The inherent serial nature of magnetic bubble technology makes it ideally suited to a pipeline computational structure with a minimum of internal feedback. Assuming a 0.5 MHz bubble propagation rate, 16-bit words, and one propagation period per bit, the throughput of a pipeline processor utilizing bubble technology could be 30,000 words per second, which represents a capability of processing signals of 15 KHz bandwidth. This speed is adequate for many applications. For example, the speed required for voice processing is well within the capability of existing bubble technology.

It is desirable therefore and an object of the invention in its most general sense, to provide pipeline designs for serial arithmetic bubble devices which will take maximum advantage of the characteristics of magnetic bubble technology and which will form the basis for the designs of special purpose processors, for applications which lend themselves to pipeline processing.

Accordingly, an approach to the design of serial arithmetic devices has been developed using principles which are intended to facilitate the hardware design and to achieve maximum use of chip area. The same type of bubble interaction, i.e., bubble repulsion to prevent bubble transfer, is used in all gates so that their design will be similar. Furthermore, only two-input gates are used since these structures are the simplest and require the least development effort. Although three-input gates may be used, they are more complicated and are not essential for achieving a reasonably compact design. My designs for serial arithmetic elements demonstrate that serial arithmetic can be performed by a compact arrangement of a small number of different types of basic bubble logic gates. These basic circuits are not burdened with excessive numbers of bubble generators, annihilators, or crossovers, and no problem is encountered with fan out. Furthermore, by using only two-input gates and a pipeline computational structure, the geometry of the circuits is significantly simplified. This facilitates the hardware design and permits reasonably high computing power to chip area ratios to be achieved. Consequently, special purpose pipeline bubble logic processors utilizing these designs can be made to compare favorably with conventional semiconductor logic designs.

To facilitate an understanding of the invention, it is helpful to define certain terminology used herein. The term "element" refers to the various two-input bubble logic gates and components illustrated in FIGS. 1 and 2, and the incremental adder of FIG. 3A which form the basic building blocks for implementing circuits which perform arithmetic operations. A "unit" is an interconnection of elements which performs some function, such as an arithmetic operation. The term "device" refers generically to an interconnection of units or elements. The term "pipeline" refers to the structure of a device in which the geometry of its units is such that processing operations are sequentially performed on a continuous flow of serial data through the units, without data feedback paths internal to the units.

A magnetic bubble device for performing serial integer arithmetic on binary integers which provides the aforementioned and other advantages may include input means for two magnetic bubble streams that are representative of two binary integers upon which the arithmetic operation is to be performed, output means for outputting a magnetic bubble stream which is representative of the result of the arithmetic operation and an arithmetic unit comprising a plurality of magnetic bubble elements, including at least a first two-input bubble logic gate for performing a logical operation on two binary integers input to the gate, the elements being interconnected in a predetermined pipeline configuration between the input and output means, for performing a predetermined arithmetic operation on the binary integers.

BRIEF DESCRIPTION OF THE DRAWINGS

FIG. 1 comprising

FIG. 2 comprising

FIG. 3 comprising

FIG. 5 comprising

FIG. 9 comprising

DETAILED DESCRIPTION OF PREFERRED EMBODIMENT

The basic two-input gates utilized as building blocks for constructing serial arithmetic function devices are illustrated in FIG. 1. The symbolism employed corresponds closely to actual gate construction. The convention is adopted that data flow is from left to right unless an arrow indicates otherwise. Logic is accomplished by introducing a preferred transition between two parallel propagation paths. An input bubble, in the absence of a second input bubble on a parallel path, will transfer from one path to the other in the direction indicated by the arrow. When two bubbles enter simultaneously on parallel paths, the mutual repulsion between them prevents the transfer and both bubbles continue to propagate along the path on which they are entered.

Figure 1A:
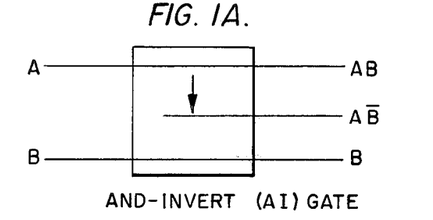
FIGS. 1A–1D illustrates the basic two-input logic gates which are utilized as building blocks for implementing serial arithmetic function devices.

FIG. 1A illustrates an AND-INVERT (AI) gate. As illustrated, there is a preferred transition path for a bubble input at A to output path AB. If two bubbles are simultaneously input on paths A and B, they will propagate through the gate with the input bubble on path A appearing at output AB and the input bubble at path B appearing at output B. The presence of the bubble on path B prevents the bubble at input A from making the preferred transition to output AB. If a bubble is input on path A only, it will make the preferred transition and appear on output path AB. A bubble input on path B will always appear at output B, since there is no transition path provided in the gate. Consequently, output AB is the AND output of the gate and output AB is the AND-INVERT output. Input B controls the gate operation.

Figure 1B:
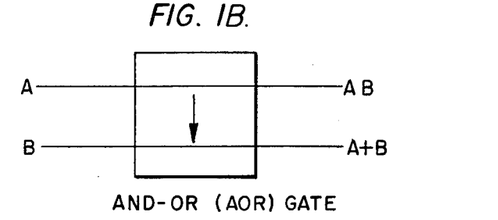

FIG. 1B illustrates an AND-OR (AOR) gate. For a bubble input on path A, there is a preferred transition to OR output A+B. If bubbles are simultaneously input on inputs A and B, repulsion between the two bubbles will prevent the bubble on path A from making the preferred transition and it will appear at AND output AB. In any case, a bubble input on path B will appear on output A+B.

Figure 1C:
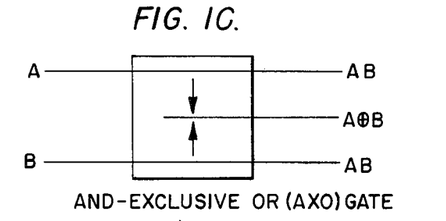

FIG. 1C illustrates an AND-EXCLUSIVE OR (AXO) gate. As illustrated, preferred transitions exist between both input paths A and B and output path A⊕B. This output represents the modulo 2 addition (exclusive-OR function) of the two inputs. A bubble input on either path A alone or path B alone will appear at this output. Bubbles simultaneously entered on path A and B will prevent the transition of either bubble to the exclusive-OR output and each will propagate through the gate and appear on its respective AND output, AB.

Figure 1D:
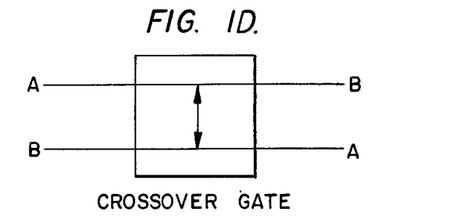
Figure 2A:
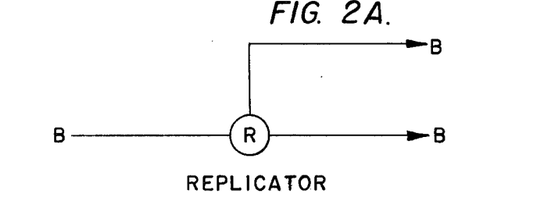
FIGS. 2A–2D illustrates additional components necessary for implementing the serial arithmetic functions.
Figure 2B:
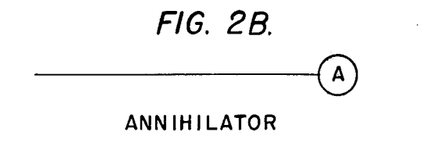
Figure 2C:
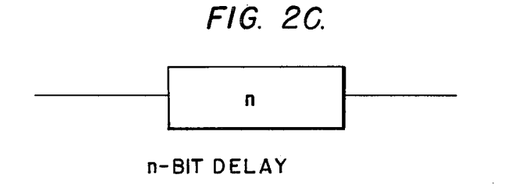
Figure 2D:
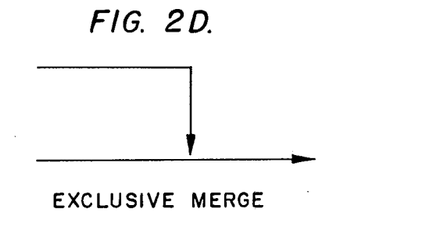

FIG. 1D illustrates a Crossover (CO) gate. This gate operates with a resident bubble. Crossover of two parallel paths is accomplished by trapping a bubble in an idling position between the paths. With no input, this bubble oscillates between the two paths in a manner similar to the transfer action in the logic gates. A bubble from either input approaches the idling bubbles when it is near the opposite propagation path. The repulsion forces the idling bubble to exit on the opposite path (crossover action) and the incoming bubble becomes trapped in the idler. When two bubbles enter, they do not approach the idler simultaneously, due to a phase difference (½ period delay) which is provided between the two input paths. In this case, the first input bubble interacts with the idling bubble as described above, but the second input arrives before the first bubble can become trapped. Repulsion between the first and second bubbles forces the first bubble to remain on its propagation path and it exits the crossover gate. The second bubble then becomes trapped in the idler.

The gates illustrated in FIGS. 1A–1C may be implemented with designs given in the previously cited references to Garey, Kohara, Caron and Minnick. A suitable design for the crossover gate of FIG. 1D is given in U.S. Pat. No. 3,543,255 to Morrow.

Other elements necessary for implementing serial arithmetic devices are the components illustrated in FIG. 2. The replicator of FIG. 2A uses the field from propagation patterns to stretch and split bubbles. A suitable design is given in U.S. Pat. No. 3,868,661 to Bonyhard. The annihilator of FIG. 2B collapses bubbles by trapping them near an unfavorable magnetic pole. A suitable design is illustrated in U.S. Pat. No. 3,701,125 to Chang. The n-bit delay of FIG. 2C is achieved with a folded propagation path having a length necessary for the required delay, and the exclusive merge of FIG. 2D is a simple junction of two propagation paths which logically can not have bubbles in equivalent positions.

Addition

Binary integer representation is assumed with the presence or absence of a bubble representing 1 or 0, respectively. Numbers move serially along propagation paths, least significant bit first. One number is left shifted with respect to another by propagating it through delay. A right shift is accomplished by delaying the other path. Since all propagation paths represent delay, the delays shown explicitly in the figures are relative to the other paths. Only those delays are shown which represent a signficant feature of the algorithm or which are important for circuit design considerations.

Figure 3A:
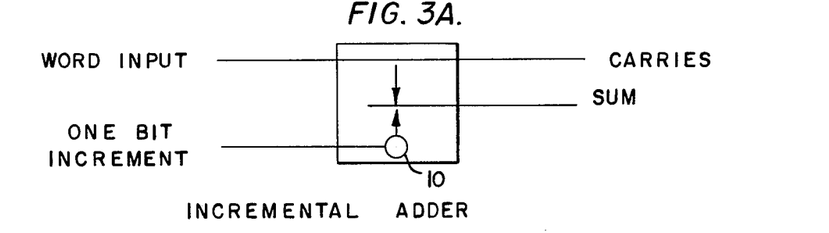
FIGS. 3A–3B illustrates an incremental adder and a serial adder for performing serial addition.

FIG. 3A illustrates an incremental adder, formed by returning one AND output of the AXO gate illustrated in FIG. 1C to its corresponding input, to form a closed carry loop, represented by circle 10, with a delay of one bit interval. This device functions as an incremental adder because it will add 1 bit to a number if a solitary input bubble enters the one bit increment input to the carry loop 10. The carry is propagated (delayed) by remaining in the loop until it falls into a vacant position in the input word. All carries produced by the addition operation exit from the carry output. The incremental adder of FIG. 3A is useful in forming the 2's complement and is valuable as a control element. In the latter case, the word input is a stream of bubbles with at least one vacancy occuring at the word interval. A bubble supplied to the carry loop will divert the bubble stream from the sum output to the carry output, until a vacancy arrives to empty the loop.

Figure 3B:
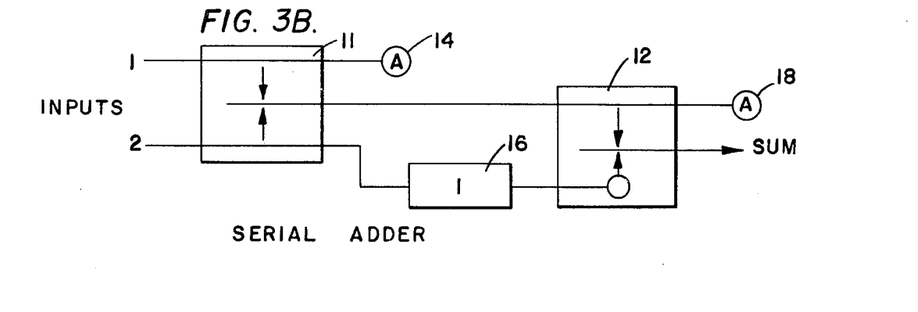

Combining the incremental adder of FIG. 3A with a half adder (AXO gate), 11, forms a true serial adder as illustrated in FIG. 3B. The two numbers to be added are input to AXO gate 11. The exclusive-OR output of AXO gate 11 is fed to the word input of incremental adder 12. One AND output of AXO gate 11 is connected to annihilator 14. The second AND output of AXO gate 11 is connected to the 1-bit increment input of incremental adder 12 through a 1-bit delay 16. The carry output of incremental adder 12 is fed to annihilator 18 and the sum of the two inputs appears at the sum output. Carries are produced in advance by AXO gate 11 and are routed to the carry loop of incremental adder 12. Bubbles entering this loop can not encounter a previous carry since the generation of a carry creates a vacant position in the word that arrives first and empties the loop.

Figure 4:
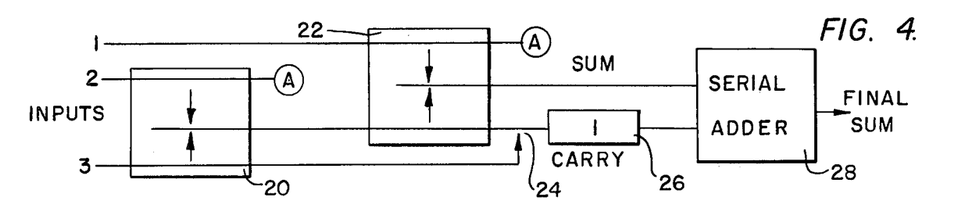
FIG. 4 illustrates a carry-save adding technique, which performs addition of three inputs without recirculating carries.

FIG. 4 illustrates a carry-save technique to perform multiple additions. Three numbers are combined by two half adders, AXO gates 20 and 22. The carry outputs of these gates can be merged in exclusive merge 24, since the addition of three numbers can at most produce one carry at each bit position. The combined carry output is then delayed by 1-bit delay 26, to achieve alignment for subsequent addition. The sum and carry outputs of the carry-save stage comprising gates 20 and 22, exclusive merge 24 and 1-bit delay 26, can be routed to other carry-save stages or the final sum can be computed with a serial adder, 28, as illustrated. The carry-save scheme illustrated in FIG. 4 can add many numbers with only one carry-propagating adder being required. This technique has the potential for conserving chip area since carry delay loops are not used.

Subtraction

Figure 5A:
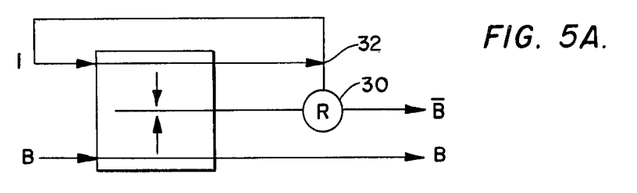
FIGS. 5A–5C illustrates an inverter circuit, a 2's complement circuit and a subtraction device for implementing serial subtraction.

Subtraction may be accomplished by forming the 2's complement and adding. The 2's complement can be generated conveniently by forming the logical inverse and adding 1. Inversion may be accomplished, for example, by supplying a continuous stream of bubbles (logical 1) to one input of either an AI gate or an AXO gate. However this requires a bubble generator to provide the continuous stream of bubbles. A self-contained inverter, not requiring a bubble generator, is illustrated in FIG. 5A. The exclusive-OR (inverted output) of an AXO gate is replicated with replicator 30, merged with one of the gate's AND outputs, using an exclusive merge 32, and fed back to the 1 input of the gate corresponding to that AND output. This feedback loop provides a continuous stream of bubbles in the gate, which are used to invert an input at B. The circuit is self-initializing, since any vacant positions in the recirculating path formed by the feedback, will eventually be filled from the input. The inverted output is taken from replicator 30. An uninverted output also appears at the second AND output of the gate, which may be annihilated if not needed.

Figure 5B:
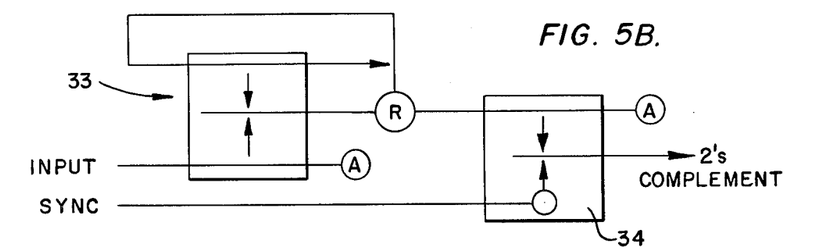

FIG. 5B illustrates one method of generating the 2's complement, using the inverter of FIG. 5A and an incremental adder, 34. An input is inverted in inverter 33 and supplied to the word input of incremental adder 34. A sync input, consisting of a single bubble synchronized with the beginning of each word, is supplied to the 1-bit increment input of adder 34. The sum output of adder 34 is the 2's complement of the input. This 2's complement may be combined with a second input in a serial adder to provide subtraction. It is assumed that sync bubbles are available and can be routed to any location with sufficient delay to give proper timing. if a zero input is complemented or if signed numbers are added, there must be a high-order vacant position in each word to accommodate an overflow bubble and provision must be made for removing or ignoring overflows.

Figure 5C:
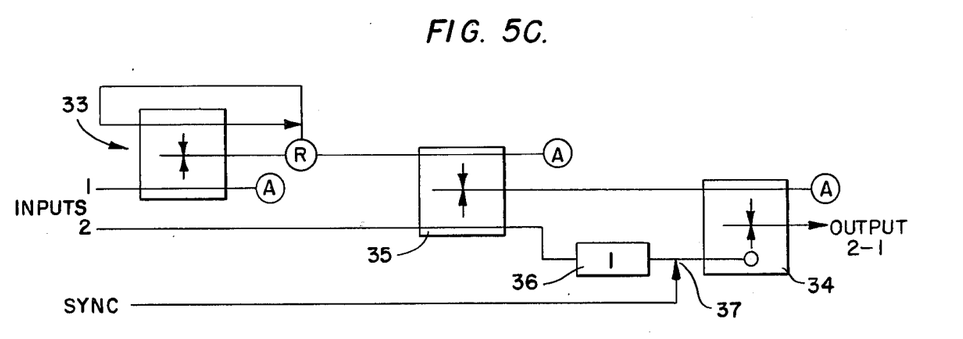

When one number is added to the complement of another number, a separate incrementing adder is not needed to form the complement. In this case, the sync may be supplied directly to the carry loop of the serial adder. An efficient subtraction device may be implemented as shown in FIG. 5C, by the addition to the 2's complement circuit of FIG. 5B an AXO gate, 35, a 1-bit delay, 36, and an exclusive merge, 37, for supplying the sync bit to the incremental adder, 34. Incremental adder 34, AXO gate 35 and 1-bit delay 36 form a serial adder. Inverter 33 inverts the subtrahend at input 1 and the result is added to the minuend at input 2 by the serial adder. The 2's complement is completed by supplying the sync bit to the carry loop of incremental adder 34, via the exclusive merge 37.

Multiplication

Figure 6:
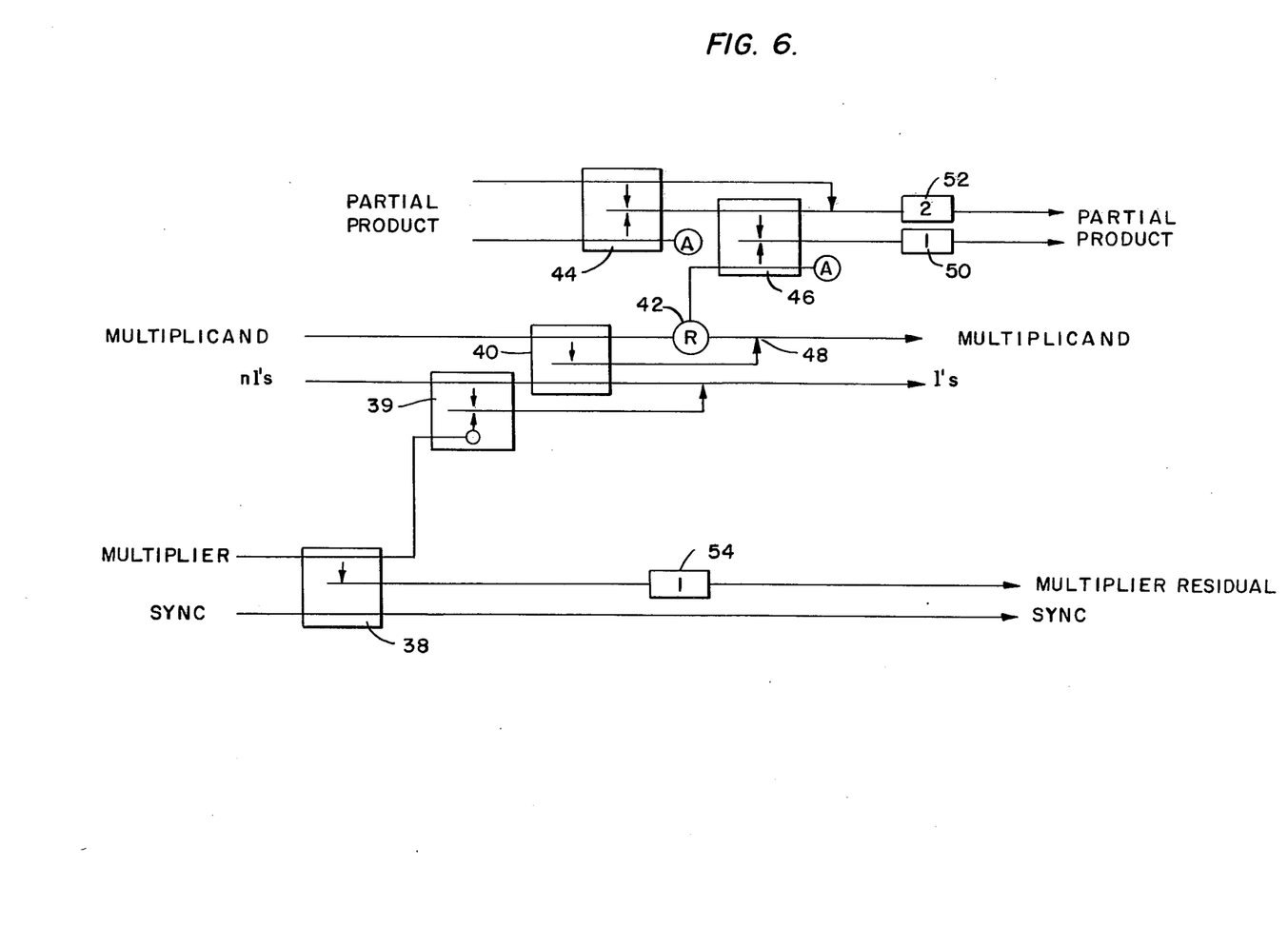
FIG. 6 illustrates one embodiment of a pipeline multiplication cell for multiplying non-negative numbers.

FIG. 6 illustrates one cell of an embodiment of a pipeline multiplier. In the illustrated embodiment, each such cell adds the shifted multiplicand if the corresponding multiplier bit is 1. An n-bit multiplier word requires n multiplication cells. The pipeline multiplier illustrated in FIG. 6 will multiply positive or zero numbers. Signed numbers must be converted to magnitudes with the sign of the product determined in advance. It is convenient to place the product sign bit in the product propagation path prior to multiplication. Both multiplier and multiplicand are n-bit words with at least n+1 high-order zeros to allow space for the full precision and sign of the product.

The multiplier enters the first cell with its most significant bit aligned on the least significant bit of the multiplicand. The multiplier enters AI gate 38 along with a sync bubble. The sync bubble picks off a multiplier bit, beginning in the first cell with the most significant position. This multiplier bit enters the incremental adder 39 where it diverts a stream of n bubbles also entering adder 39, through AI gate 40. The multiplicand enters the second input of AI gate 40. The bubble stream causes the multiplicand to be replicated in replicator 42, into a carry-save adder comprising gates 44 and 46. A serial adder could be used in place of the carry-save adder, if desired. The multiplicand is further transmitted to the next cell, either from the output of replicator 42 or from the invert output of AI gate 40, via exclusive merge 48. The sum and carry outputs of AXO gate 46 of the serial adder are output as a partial product to the next cell, via 1-bit delay 50 and 2-bit delay 52. These delays left-shift the partial product by 1-bit with respect to the multiplicand. The 1-bit delay 54 on the invert output of AI gate 38 aligns the next most significant multiplier bubble's position with the sync bubble, prior to input to the next cell. High-order vacancies following the n-bubble stream carry away the used multiplier bubbles.

Gates 44 and 46 of the carry-save adder can be eliminated, if desired, from the first multiplication cell since there is no partial product at that point. In this case the output of replicator 42 would be fed to the second cell through a 1-bit delay. Similarly, only one AXO gate, 46, would be required in the second cell to accept this input. Thereafter, subsequent cells would require both gates 44 and 46. Subsequent to the final multiplication cell, the two partial products are combined by a serial adder to produce the result. The multiplication cell of FIG. 6 has the capability of clamping or holding the multiplier in place if the n-bubble input is replaced by a continuous stream of bubbles. A sequence of n-vacancies will release the multiplier.

Figure 7:
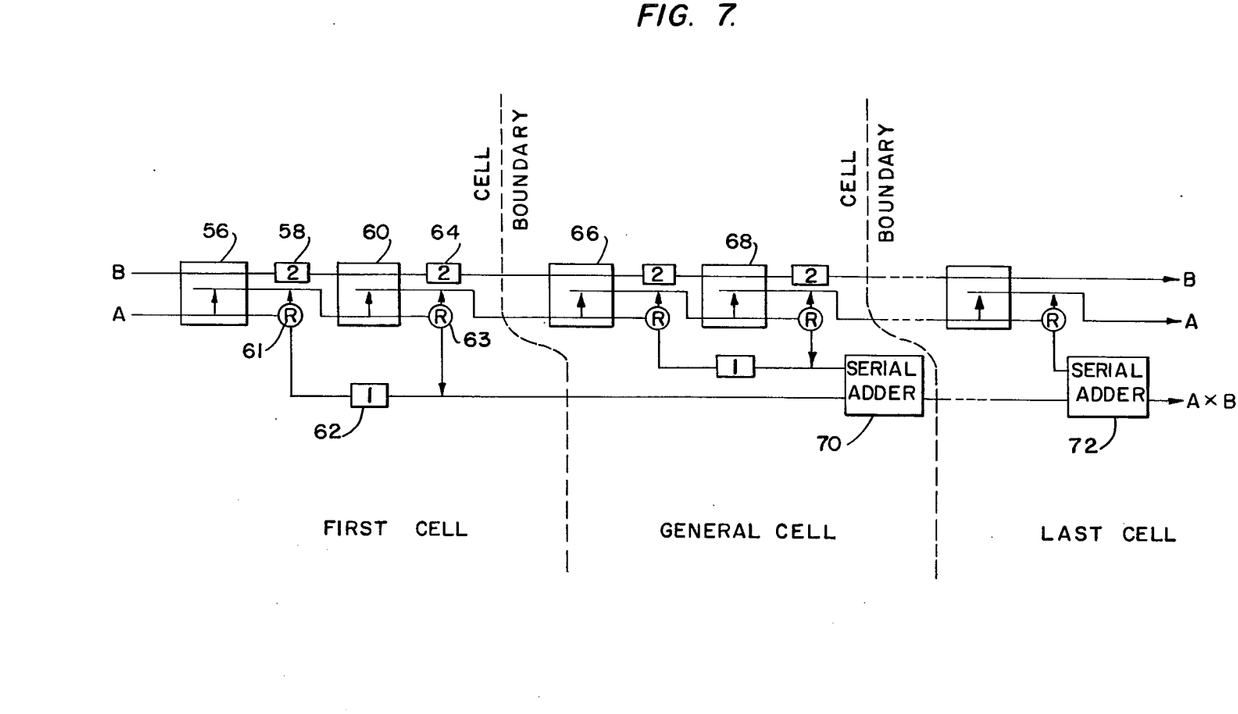
FIG. 7 illustrates a second embodiment of a pipeline multiplication cell.

An alternative embodiment of a pipeline multiplier for positive numbers is illustrated in FIG. 7. Although FIG. 7 illustrates an embodiment using bubble logic, the algorithms embodied in the implementation and to be described hereinafter, may be implemented in CCD's or conventional semiconductor devices. Although the illustrated multiplier operates only with positive numbers, modifications could be made to allow multiplication of 2's complement numbers.

Conventional multiplication is done by examining individually each bit of the multiplier word and adding the shifted multiplicand if the multiplier bit is a one. The multiplication scheme illustrated in FIG. 7 does not look at individual multiplier bits. It generates partial products by performing the logical AND operation between the multiplicand and multiplier, for each of 2n-1 positions, obtained by shifting the multiplicand with respect to the multiplier. Both multiplier and multiplicand must be in a "spread" format, which is generated by placing a zero between each pair of adjacent bits. Thus an n-bit word is spread to occupy 2n bit positions. Adjacent words in the data streams must be separated by 2n vacant positions.

Processing begins with the least significant bit of the multiplier aligned with respect to the most significant bit of the multiplicand or vice versa. The multiplier and multiplicand are input to AI gate 56 and a logical AND operation is performed. The result is a partial product which contains either even bits only or odd bits only with respect to the final product. The multiplier which was input to AI gate 56 on input A is recovered by merging one output of replicator 61 with the invert output of AI gate 56. The recovered multiplier is then input to AI gate 60. The multiplicand, which was input to AI gate 56 on input B, is left-shifted 2 bits by a 2-bit delay 58 and a second AND operation is performed by AI gate 60, on the multiplicand and the multiplier. This produces a partial product complementary to the previous product, i.e., even bits instead of odd, or vice versa. The first partial product from replicator 61 is left-shifted one bit by 1-bit delay 62, to give it the proper numerical value and it is merged with the second partial product from replicator 63. The even-odd bit arrangement permits the combination of the data streams by the simple merge. The multiplicand is again left-shifted by 2-bit delay 64. The left-shifted multiplicand, the multiplier and the partial product from replicator 63 are then fed to the next multiplication cell.

In the next cell, the process is repeated with AND operations performed by AI gates 66 and 68. The process continues until 2n-1 partial products have been generated. The partial products from each cell are merged in pairs and the resulting data streams are combined in adders. For example, the partial products from the first and second cell are combined in serial adder 70. It is also possible to use the carry-save adding scheme. Since the number of partial products is odd, the final partial product is not paired. It must be added to the accumulated partial products by a separate serial adder 72. However since the final partial product consists of only one bit, this adder may be an incrementing adder. The output of adder 72 is the desired product.

When the multiplication scheme of FIG. 7 is used to square a number, the symmetry of the operations allows the square to be produced after only n partial products have been generated. The scheme for squaring is the same as previously described, however the operation is terminated after the nth partial product is produced. Prior to adding the nth partial product, the accumulated partial product is doubled, i.e., left-shifted, to account for the symmetric part of the process which was omitted. If the squaring operation is begun with the operands in the maximum overlap position, the high-order portion of the square will be generated first and the operation may be truncated at any step short of completion to produce an approximate result.

Figure 8:
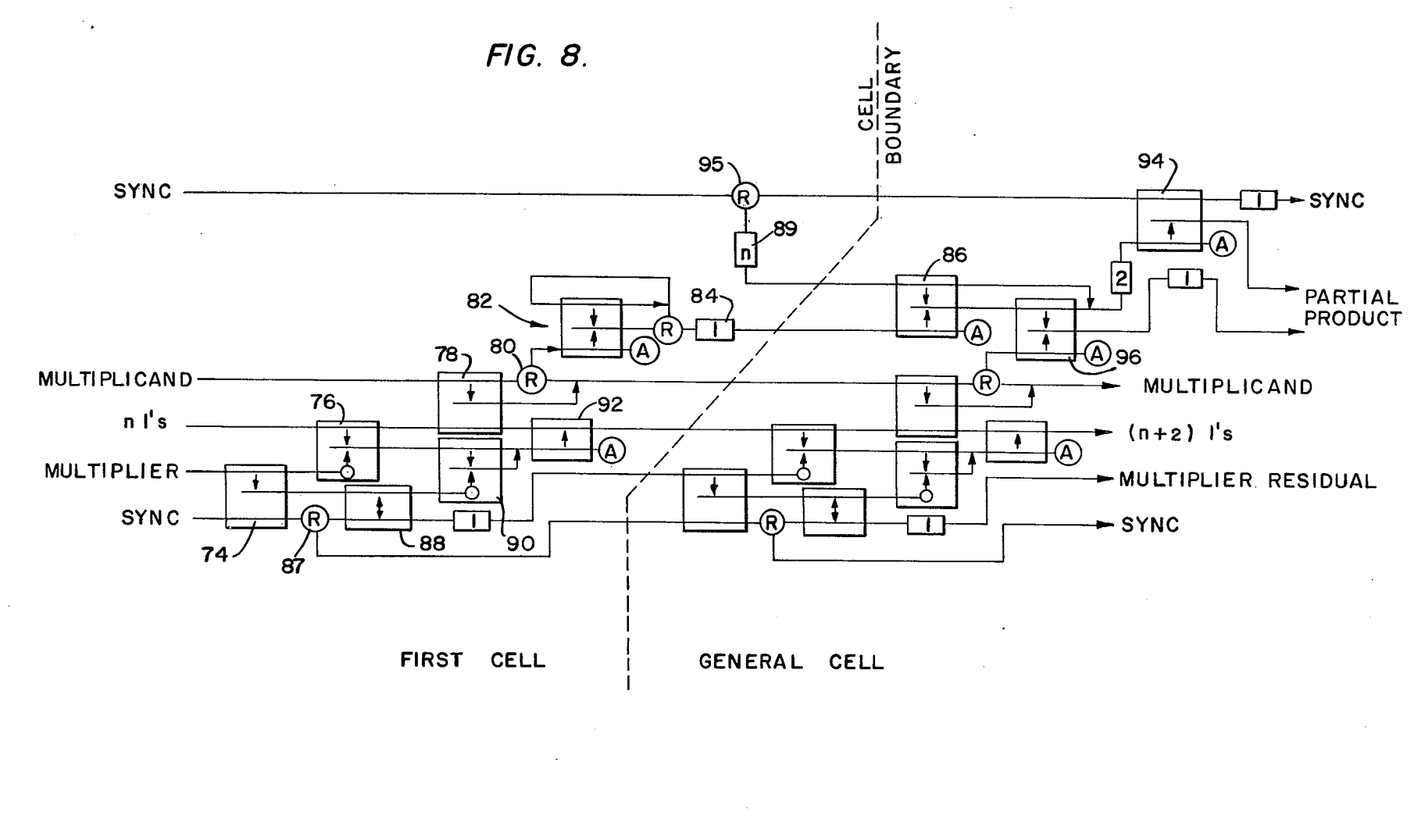
FIG. 8 illustrates a 2's complement multiplier.

FIG. 8 illustrates a 2's complement multiplier in which both the multiplier and the multiplicand may be in 2's complement form. There are four conditions which must be satisfied when 2's complement numbers are multiplied and which cause this circuit to be different from a positive number multiplier. First, when a negative multiplicand is right-shifted, it sign bit must be extended (repeated) on the left in the high-order position. Secondly, in order to match the length of the multiplicand, the 1's stream must also be extended on the left in each cell. Third, when the multiplier is negative, the result of performing multiplication with a 2's complement multiplier is the product $(2^N-A)B$, where A is the absolute value of the multiplier and B is the multiplicand. The correct result is therefore obtained by subtracting $2^NB$. This is done by first generating the complement of $2^NB$ in the first cell if the multiplier is negative. Fourth, the addition of 2's complement numbers can produce an overflow at each cell and all overflow bubbles must be removed to keep the length of the product within prescribed bounds.

The multiplicand is assumed to have either n high-order zeros or n high-order ones. Thus, the bubbles necessary for satisfying the first condition are carried along with the multiplicand if it is negative. By satisfying the second condition, the extended 1's stream automatically deflects the proper number of bubbles from the multiplicand to meet the first condition. The first cell of the 2's complement multiplier of FIG. 8 is a modified version of the general cell used in the remainder of the circuit. It generates the number $-2^NB$ if the multiplier is negative.

Referring to FIG. 8, in the first cell the sync bit picks off the multiplier sign bit in AI gate 74 and sends the bit to incremental adder 76. This bit deflects a 1's stream of bubbles entered at the word input of adder 76 into the carry output of adder 76 and thus through AI gate 78. This causes the multiplicand, which is input into AI gate 78, to be diverted into replicator 80, which feeds an inverter 82. The multiplicand is thus inverted and supplied to the second cell of the multiplier through a 1-bit delay 84. In the second cell, the inverted multiplicand is input to AXO gate 86 along with a sync bit supplied from replicator 95 through n-bit delay 89. The sync bit causes a 1 to be added to the inverted multiplicand in AXO gate 86 to complete the formation of the 2's complement.

The sync bit supplied with the multiplier to AI gate 74, passes through the gate to replicator 87 where it is replicated and passed to crossover gate 88 and into the carry loop of incremental adder 90. If the 1's stream has not been diverted in incremental adder 76, the sync bit will remain in the carry loop until if falls into the first vacancy following the 1's stream. Thus the 1's stream is extended on the left by one bit as required by the second condition. If the 1's stream is deflected in adder 76, the multiplier bit will provide the required extension and the sync bit transmitted to adder 90 will pass through AOR gate 92 and be annihilated. Removal of any overflow bit to satisfy the fourth condition, is accomplished in AI gate 94 by a sync bubble from replicator 95.

The remainder of the circuit operates as previously described for multiplying positive numbers. Gates 86 and 96 constitute a carry-save adder which adds the shifted multiplicand to the accummulated partial product, if the corresponding multiplier bit is a 1. After the final multiplication cell, the two partial product streams must be added in a serial adder to generate the final product.

The delays shown in FIG. 8 correspond to a bubble data format in which there are 2n bits per word, including a position for a single over-flow bit. The basic single precision word is n-bits long, which includes a high-order sign bit. It is to be understood that the delays may be adjusted to provide proper alignment and synchronization for other data formats.

Division

Figure 9A:
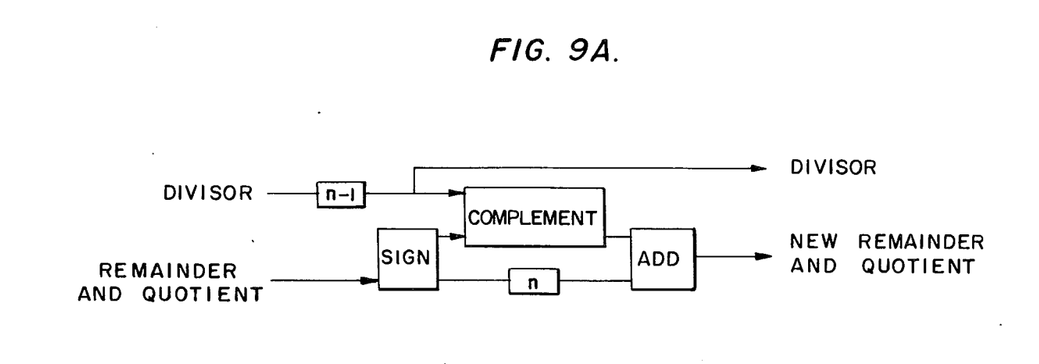
FIGS. 9A and 9B illustrates the operation and a pipeline logic design for a non-restoring division cell.

A pipeline bubble divider may be implemented using a non-restoring division technique. FIG. 9A is a block diagram illustration of a representative cell of such a divider. For n-bit words, a chain of n such cells in tandem are required. A positive divisor is assumed but the dividend and quotient may be in 2's complement form. The quotient is not collected separately but is generated automatically by overflows which occur when a nonnegative remainder is produced. A series of successive add or subtract operations reduces the magnitude of the remainder. If the remainder sign bit is removed prior to addition, there will be a vacant position for an overflow (quotient) bit, and a quotient will form in the space formally occupied by the high-order portion of the remainder.

The divisor, dividend and quotient are assumed to be n-bit signed integers, but the dividend has n high-order zeros or n high-orders ones. Referring to FIG. 9A the divisor and dividend enter the first cell with the divisor aligned on the n high-order bits of the dividend. In subsequent cells, the dividend input is replaced by the remainder and a partial quotient. The divisor is delayed by n-1 bits so that the unit bit is aligned with the sign bit of the remainder input. This sign bit is removed and used to control a complementing circuit. If the remainder is positive or zero, the divisor is complemented. The remainder is then delayed by n-1 bits to realign it with the divisor. An additional 1-bit delay (for a total delay of n-bits) positions the remainder and divisor (or its complement) for addition. The result of the addition is a new remainder and a quotient bit, which is input to the next cell with the divisor, appropriately delayed, where the process is repeated.

Figure 9B:
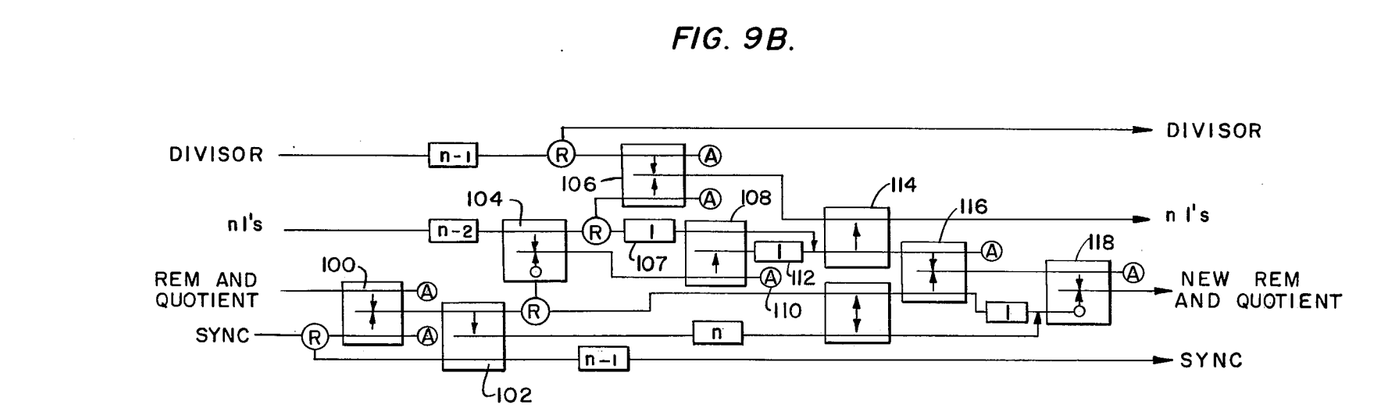

The detailed structure of a pipeline bubble division cell is shown in FIG. 9B. The remainder and partial quotient from a preceding cell enter the division cell along with a sync bit via AXO gate 100. The sync bit inverts the remainder sign bit in gate 100. This inverted sign bit is removed in AI gate 102, replicated and fed to incremental adder 104 to control a stream of n bubbles input to the word input of adder 104. This stream of bubbles exits the carry output of adder 104, is replicated and enters one input of AXO gate 106. The other input to AXO gate 106 is the divisor, which is inverted in gate 106 by the stream of bubbles. After the stream of n bubbles have passed through adder 104, the inverted sign bubble leaves the carry loop and enters AI gate 108, where it is diverted into an annihilator 110, by the last bubble of the n-bubble stream which has been delayed 1-bit by delay 107. The invert output of gate 108 is delayed by 1-bit delay 112 to match the 1-bit delay produced by delay 107 and is merged with the AND output to yield a single path for the n-bubble stream. The divisor from AXO gate 106 and the n-bubble stream enter AOR gate 114, which functions as a crossover since one input is all 1's. The divisor or its inverse is output from the AND output of AOR gate 114 and input into a serial adder comprised of AXO gate 116 and incremental adder 118. The remainder is also input into the serial adder and is added to the divisor or its inverse. The inverted sign is inserted into the carry loop of incremental adder 118 to complete formation of the 2's complement. The output from the serial adder is the new remainder and quotient, which is input to the next division cell, along with the divisor, sync and stream of bubbles, where the process is repeated.

The delays shown in FIG. 9A are incorporated in FIG. 9B with corresponding delays of the n-bubble stream and the sync. There are several design options for avoiding long delays other than those required for the divisor and the remainder. One possibility is to invert the n-bubble stream at each cell, since it contains high-order zeros. If the sync is derived from this inverted stream, the sync will also be delayed. Apart from the delays required for the divisor and the remainder, the division cell of FIG. 9B requires relatively long propagation paths to connect cells and to connect gates within the cell. If a reduced throughput can be tolerated, it is attractive to perform division recursively.

Figure 10:
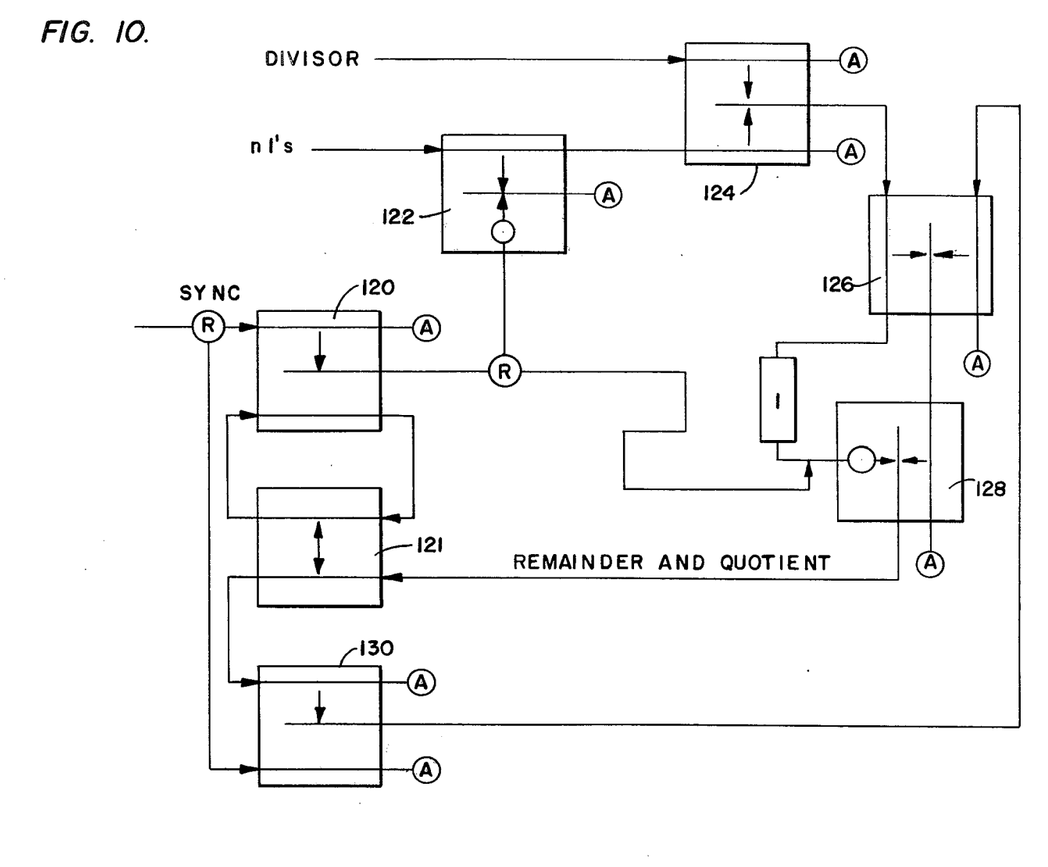
FIG. 10 illustrates a pipeline division circuit having a recursive connection.

A recursive division circuit is illustrated in FIG. 10. Logic is similar to the divider of FIG. 9, but a recursive connection is made to the pipeline so that the remainder and quotient circulate in a closed path. The circulating remainder from crossover gate 121, enters AI gate 120 where the sync produces a copy of the sign bit and its inverse. The inverted sign bit is used in incremental adder 122 to control inversion of the divisor by AXO gate 124. A serial adder composed of AXO gate 126 and incremental adder 128, combines the divisor or its inverse with a delayed remainder from AI gate 130 and inverted sign to form a new remainder and a quotient bit. Prior to addition, the remainder is aligned with the divisor via a delay path which passes through crossover gate 121 and AI gate 130, where the sign bit is removed.

It is assumed that the divisor, n-bubble stream, and sync are supplied repeatedly at the word interval with proper timing. Means for removing the remainder and quotient and inserting a new dividend are not illustrated. The remainder and quotient may be removed, however, by inserting at the output of the serial adder, an AI gate with a 2n-bubble control input. A new dividend may be input using an exclusive merge on the path from the serial adder to AI gate 120.

A fundamental problem with recursive division is that the delay necessary to align the remainder and the divisor consumes a large portion of the closed path for the quotient and the remainder. For a fixed word interval (division cycle time), the gates for complementing and adding must be constructed in a limited path length. The configuration of the circuit of FIG. 10 has been chosen to minimize propagation time through most of the logic and to return the new remainder to AI gate 120 with minimum delay. Removal of the remainder sign bit occurs on a less critical path. As should be obvious from the above, multiplication may likewise be performed using a circuit similiar to that of FIG. 10, having a recursive connection to the pipeline.

While the foregoing has been with reference to specific embodiments for implementing serial integer arithmetic with magnetic bubble logic elements, it will be appreciated by those skilled in the art, that numerous changes may be made without departing from the spirit and the principles of the invention. For example, a multiplexed data format wherein N data streams have been interleaved bit by bit, may also be processed in any of the arithmetic devices disclosed. In this case, all delays and carry loop lengths must be increased by a factor of N, the sync bits replaced by N successive bits and the 1's streams lengthened by a factor of N. It is intended that the invention be limited only by the appended claims.

What is claimed is:

1. A magnetic bubble device for performing an arithmetic operation on magnetic bubble streams representative of binary numbers, comprising:
input means for two or more magnetic bubble streams representative of binary numbers;
output means for at least one bubble stream representative of the result of the arithmetic operation; and
a magnetic bubble arithmetic unit connected between said input and output means, said arithmetic unit comprising:
a plurality of magnetic bubble elements, said plurality including a first two-input AND-EXCLUSIVE OR bubble logic gate, said gate having first and second continuous, uninterrupted paths extending from the input to the output of said gate for the passage of bubbles therethrough, the outputs of said paths representative of the logical AND operation performed on bubbles input to said paths, and a third output path disposed between said first and second paths for providing an output representative of the EXCLUSIVE OR operation performed on bubbles input to said first and second paths, said gate further having a pair of preferred transition paths from said first and second paths to said third path such that a bubble entering on either of said first or second paths, in the absence of a bubble entering on the other path, exits the gate on said third path, said plurality of magnetic bubble elements interconnected in a fixed logical pipeline configuration within said unit for performing a predetermined arithmetic operation, said configuration characterized by an absence of bubble feedback paths internal to said unit.

2. The device of claim 1 wherein said arithmetic unit further comprises an incremental adder bubble logic element having a first word input and a second one bit increment input, said word input connected to said EXCLUSIVE OR output of said first AND-EXCLUSIVE OR gate and said one bit increment input connected through a 1-bit delay element to said AND output of said gate, thereby providing a serial adder for adding two binary integers input to said gate.

3. The device of claim 2 further including bubble annihilators for annihilating unused bubble outputs from said gate.

4. The device of claim 3 further comprising second and third AND-EXCLUSIVE OR bubble logic gates interconnected together on the inputs to said serial adder, for providing a carry-save adder for adding three binary integers.

5. A magnetic bubble device for performing an arithmetic operation on magnetic bubble streams representative of binary numbers, comprising:
input means for two or more magnetic bubble streams representative of binary integers;
output means for at least one bubble stream representative of the result of the arithmetic operation;
an airthmetic unit connected between said input and output means, said arithmetic unit comprising a plurality of magnetic bubble elements, said elements including:
a first two-input AND-EXCLUSIVE OR bubble logic gate having first and second inputs, and outputs representative of the logical AND and the EXCLUSIVE OR operation on said two inputs;
an incremental adder bubble logic element having a first word input connected to said EXCLUSIVE OR output of said first gate, and a second one bit increment input connected through a 1-bit delay element to said AND output of said gate, thereby providing a serial adder; and
second and third AND-EXCLUSIVE OR bubble logic gates interconnected on the inputs to said serial adder, for providing a carry-save adder for adding three binary numbers.

6. A magnetic bubble device for performing an arithmetic operation on magnetic bubble streams representative of binary numbers, comprising:
input means for two or more magnetic bubble streams representative of binary integers;
output means for at least one bubble stream representative of the result of the arithmetic operation;
an arithmetic unit connected between said input and output means, said arithmetic unit comprising a plurality of magnetic bubble elements, said elements including:
a first two-input AND-EXCLUSIVE OR bubble logic gate having first and second inputs, and first and second outputs representative of the logical AND operation and a third output representative of the EXCLUSIVE-OR operation;
a bubble replicator element having an input and first and second outputs, said replicator input being connected to said EXCLUSIVE OR output of said gate;
means for merging said first replicator output with said first AND output of said gate; and means for supplying said merged outputs to said first input of said gate, thereby providing a continuous stream of bubbles through said gate, such that a binary number input to said second input of said gate is output from said second replicator output inverted with respect to said input binary number, thereby providing an inverter.

7. The device of claim 6 further including an incremental adder connected to the output of said inverter such that the output of said incremental adder is the 2's complement of the binary number input to said inverter.

8. The device of claim 6 further comprising a serial adder connected to the output of said inverter for adding said inverted binary number with a second binary number input to said serial adder and means for supplying a sync input to said serial adder, such that the output of said serial adder is a binary number equal to the difference between said input binary numbers, thereby providing a subtraction device.

9. A magnetic bubble device for performing multiplication and division arithmetic operations on magnetic bubble streams representative of binary numbers, comprising;
   input means for two or more magnetic bubble streams;
   output means for at least one bubble stream representative of a partial arithmetic operation performed on said input bubble streams;
   a magnetic bubble cellular unit connected between said input and output means, said magnetic bubble unit comprising;
   a plurality of magnetic bubble elements, said plurality including a first group of elements configured in a fixed logical relationship to one another for performing a predetermined logical operation on said input bubble streams, and a second group of elements configured in a fixed logical relationship to one another for performing a second predetermined operation on said bubble streams, said first and second groups of elements being interconnected such that said magnetic bubble cellular unit performs said partial arithmetic operation, and wherein said bubble unit is further characterized in being adapted to be interconnected in tandem with other like bubble units in a pipeline configuration to perform said arithmetic operation.

10. The magnetic bubble device of claim 9 wherein said arithmetic operation is multiplication of two numbers, one being a multiplier and one being a multiplicand and wherein said first group of elements is configured for performing a logical AND operation on said bubble streams, and said second group of elements includes means for forming a partial product between the numbers represented by said bubble streams.

11. The magnetic bubble device of claim 10 wherein said device further comprises:
   n arithmetic cellular units connected in said pipeline, where n is the number of bits in said numbers; and
   bubble adder means for combining partial products from said cellular units to form the product of said numbers.

12. The magnetic bubble device of claim 11 wherein said AND operation examines individually each bit of said multiplier, and said means for forming a partial product further comprises means for accumulating partial products and adding said multiplicand to said accumulated partial products, when said examined multiplier bit is a one.

13. The magnetic bubble device of claim 10, further comprising means for spreading said multiplier and multiplicand by placing a zero between each pair of adjacent bits, and wherein said cellular unit further comprises delay means for successively shifting said multiplicand with respect to said multiplier prior to said AND operation.

14. The device of claim 13 wherein said means for performing said logical AND operation includes a plurality of AND-Invert bubble logic gates and said combining means includes serial adders.

15. The magnetic bubble device of claim 9 wherein said arithmetic operation is division of two numbers, one of the two numbers being a divisor and one being a dividend, said bubble device being a divider, and wherein said first group of elements includes means for determining the sign of said dividend and means for complementing said divisor when said dividend is positive or zero, and said second group of elements includes means for adding said divisor or its complement to said dividend to provide a remainder and a partial quotient.

16. The device of claim 15 wherein said divider further includes means for performing successive addition operations wherein said divisor or its complement is successively added to the remainder and partial quotient resulting from the previous addition.

17. The device of claim 16 wherein said adding means includes a serial adder.

18. The device of claim 17 wherein said means for performing said successive addition operations includes a recursive data connection to said pipeline such that said successive addition operations are performed by said serial adder.

* * * * *